(12) United States Patent
Chakrabarti et al.

(10) Patent No.: US 9,471,735 B2
(45) Date of Patent: *Oct. 18, 2016

(54) BOUNDARY BASED POWER GUIDANCE FOR PHYSICAL SYNTHESIS

(71) Applicant: International Business Machines Corporation, Armonk, NY (US)

(72) Inventors: Pinaki Chakrabarti, Karnataka (IN); Kaustav Guha, Karnataka (IN); Ricardo H. Nigaglioni, Austin, TX (US); Sourav Saha, Kolkata (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/961,962

(22) Filed: Dec. 8, 2015

(65) Prior Publication Data

US 2016/0098497 A1 Apr. 7, 2016

Related U.S. Application Data

(63) Continuation of application No. 14/501,840, filed on Sep. 30, 2014, now Pat. No. 9,286,428, which is a continuation of application No. 14/184,811, filed on Feb. 20, 2014, now Pat. No. 9,245,074.

(51) Int. Cl.
*G06F 17/50* (2006.01)

(52) U.S. Cl.
CPC ........ *G06F 17/505* (2013.01); *G06F 17/5081* (2013.01)

(58) Field of Classification Search
CPC .......... G06F 17/5045; G06F 2217/84; G06F 17/5031; G06F 17/505; G06F 17/5072; G06F 2217/78; G06F 17/5027; G06F 17/5036; G06F 17/5054; G06F 1/32; G06F 2217/62; G06F 17/50; G06F 17/5009; G06F 17/5081
USPC .................................................. 716/100–106
See application file for complete search history.

(56) References Cited

U.S. PATENT DOCUMENTS 6,289,498 B1 * 9/2001 Dupenloup ......... G06F 17/5045
716/103
6,591,402 B1 7/2003 Chandra et al.
(Continued)

OTHER PUBLICATIONS

Banovic et al., "Algorithms for Budget Management with Gate-Sizing and Other Low-Power Applications", Proc. International Conf. on Eletrro/InformationTechnology, 2006, pp. 290-294.
(Continued)

*Primary Examiner* — Binh Tat
(74) *Attorney, Agent, or Firm* — Cantor Colburn LLP; Margaret McNamara

(57) ABSTRACT

A method and system to obtain a physical design of an integrated circuit from a logical design are described. The system includes a memory device to store a logical design, and a processor to execute a synthesis engine. The processor performs a baseline synthesis to obtain a baseline physical design using timing constraints and an overall power budget, computes power assertions, performs a re-synthesis using the timing constraints and the power assertions to obtain a new physical design, compares the new physical design with the baseline physical design to determine a degradation of the new physical design in comparison with the baseline physical design, reduces a weighting of the power assertions relative to the timing constraints based on the degradation, and iteratively performs the re-synthesis, compares the new physical design with the baseline physical design, and reduces the weighting until the degradation is below a threshold value.

12 Claims, 11 Drawing Sheets

(56) References Cited

U.S. PATENT DOCUMENTS

| | | | |
|---|---|---|---|
| 6,721,924 | B2 | 4/2004 | Patra et al. |
| 7,243,312 | B1 | 7/2007 | Lysaght et al. |
| 7,337,100 | B1 * | 2/2008 | Hutton ............... G06F 17/5068 703/13 |
| 7,409,650 | B2 | 8/2008 | Oosuka et al. |
| 7,539,968 | B2 | 5/2009 | Charlebois et al. |
| 8,179,181 | B2 | 5/2012 | Lung et al. |
| 8,302,063 | B2 | 10/2012 | Bickford et al. |
| 2007/0234266 | A1 | 10/2007 | Chen et al. |
| 2008/0276209 | A1 | 11/2008 | Albrecht et al. |
| 2013/0346926 | A1 | 12/2013 | Pandurangan et al. |

OTHER PUBLICATIONS

Guha et al., "Block-based Power Analysis", Sep. 25, 2012, pp. 1-13.

Pundoor et al., "An efficient method of leakage optimisation in timing critical designs", Proc. IEEE Elec. Des. Proc. Symp., 2007, pp. 1-5.

Qian et al., "Timing-Aware Power Minimization via Extended Timing Graph Methods", Journal of Low Power Electronics, vol. 3, No. 3, 2007, pp. 318-326.

Zhao et al., "Power Optimization for VLSI Circuits and Systems", IEEE, 2010, pp. 1-4.

* cited by examiner

BOUNDARY BASED POWER GUIDANCE FOR PHYSICAL SYNTHESIS

DOMESTIC PRIORITY

This application is a continuation of U.S. patent application Ser. No. 14/501,840 filed Sep. 30, 2014, which is a continuation of U.S. patent application Ser. No. 14/184,811 filed Feb. 20, 2014, the disclosures of both of which are incorporated by reference herein in their entirety.

BACKGROUND

The present invention relates to integrated circuit (chip) design, and more specifically, to synthesis of a logical chip design to a physical design.

Computer-aided design (CAD) tools aid in the design of circuits that will ultimately be implemented as semiconductor devices. The process of converting the logical (circuit) design to the physical realization of the design is referred to as synthesis and generally results in a gate-level placed netlist (list of connections). The implementation can be organized as a set of blocks, each with a set of components. Each sub-block has a primary input and primary output for power that is then divided within the sub-block. Synthesis of a logical design typically includes input of objective functions that direct the synthesis engine to achieve a particular design. The objective functions may specify timing constrains and a power budget, for example. The timing constraints may be provided with enough specificity to ensure that the chip performance is within design tolerances. That is, as opposed to an overall budget, timing constraints may be specified on the pin level. In the physical design resulting from the synthesis, these constraints may be manifested in the length of wires and placement of devices, for example.

SUMMARY

According to an embodiment of the invention, a system to obtain a physical design of an integrated circuit from a logical design includes a memory device configured to store a logical design; and a processor configured to execute a synthesis engine, the processor being further configured to perform a baseline synthesis to obtain a baseline physical design using timing constraints and an overall power budget; compute power assertions; perform a re-synthesis using the timing constraints and the power assertions to obtain a new physical design; compare the new physical design with the baseline physical design to determine a degradation of the new physical design in comparison with the baseline physical design; reduce a weighting of the power assertions relative to the timing constraints based on the degradation; and iteratively perform the re-synthesis, compare the new physical design with the baseline physical design, and reduce the weighting until the degradation is below a threshold value.

According to another embodiment of the invention, a computer program product stores instructions which, when executed by a processor, cause the processor to implement a method of obtaining a physical design of an integrated circuit from a logical design. The method includes performing a baseline synthesis to obtain a baseline physical design using timing constraints and an overall power budget; computing power assertions; performing a re-synthesis using the timing constraints and the power assertions to obtain a new physical design; comparing the new physical design with the baseline physical design to determine a degradation of the new physical design in comparison with the baseline physical design; reducing a weighting of the power assertions relative to the timing constraints based on the degradation; and iteratively executing the performing the re-synthesis, the comparing, and the reducing until the degradation is below a threshold value.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, detailed timing constraints (e.g., pin-level) may be provided to the synthesis engine to ensure that the resulting physical design meets performance criteria for the chip. However, power constraints have not been provided at the same level of detail. While a power budget may be provided, that budget may be exceeded in order to meet the timing constraints. Without power requirements being analyzed at an increased granularity (like timing requirements), opportunities for power efficiencies in some areas to reduce overall power usage may have been missed. Embodiments of systems and methods detailed herein relate to determining and incorporating power constraints and selecting a granularity for the power constraints based on ensuring that timing performance is not compromised. The pin based power constraints (distinct from high level power budget) are referred to as power assertions.

Figure 1:
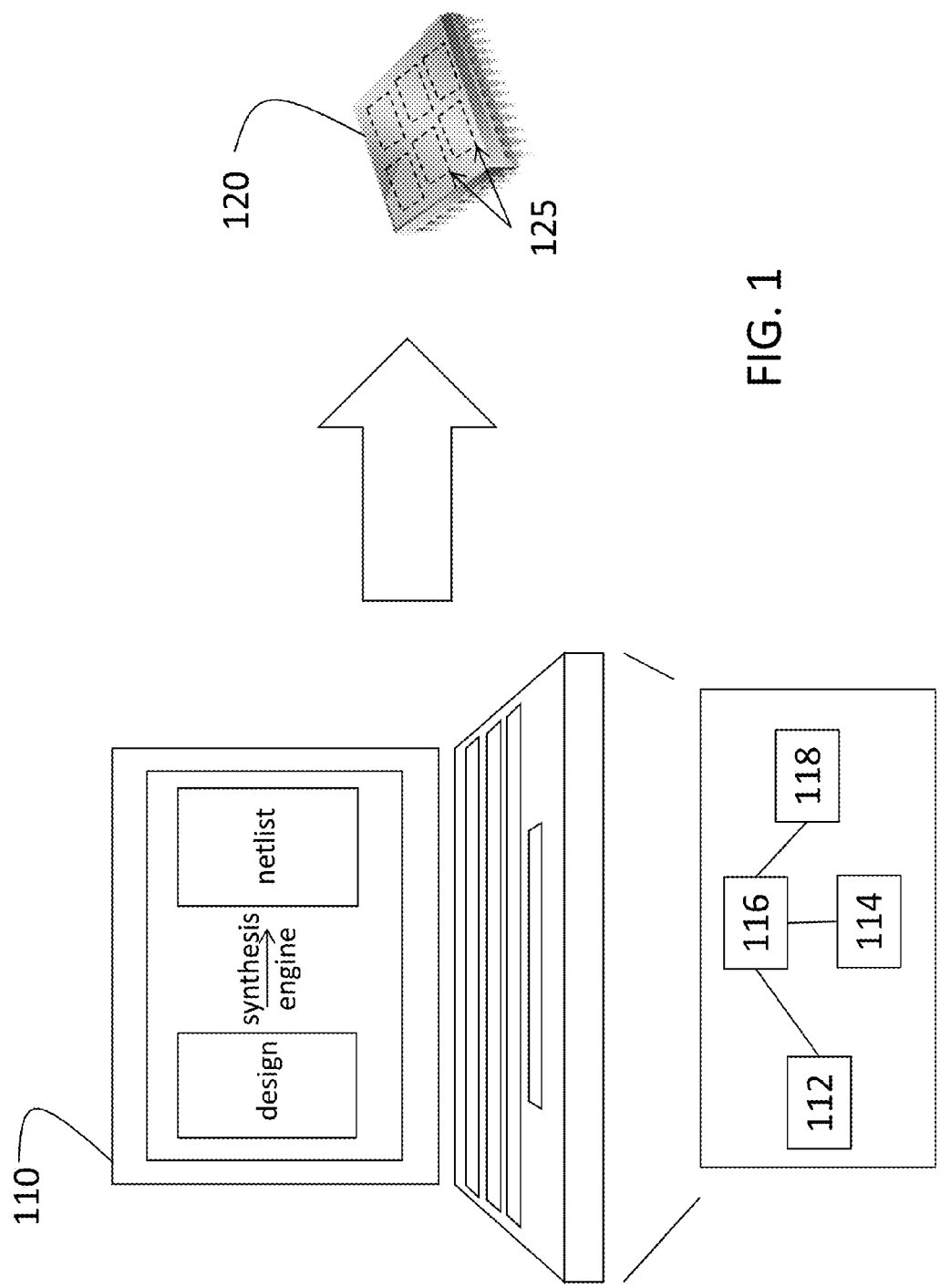
FIG. 1 is a block diagram of a system to synthesize a design according to an embodiment of the invention.

FIG. 1 is a block diagram of a system to synthesize a design according to an embodiment of the invention. A processing system 110 (e.g., computer) may implement the synthesis engine in one or more processors 116. An input interface 112 (e.g., keyboard, mouse) may be used to develop the logic design which is stored in one or more memory devices 114 of the processing system 110. An output interface 118 (e.g., display, output port) may be used to display a netlist resulting from the synthesis or provide the information to place and route components of the physical implementation 120 (e.g., chip). The physical implementation 120 includes creating components (e.g., transistors, resistors, capacitors) and interconnections therebetween on a semiconductor (e.g., silicon wafer). The physical layout of circuit sub-blocks 125 affects the length of a connecting wire between components and, thus, the timing of signals between them, for example.

Figure 2:
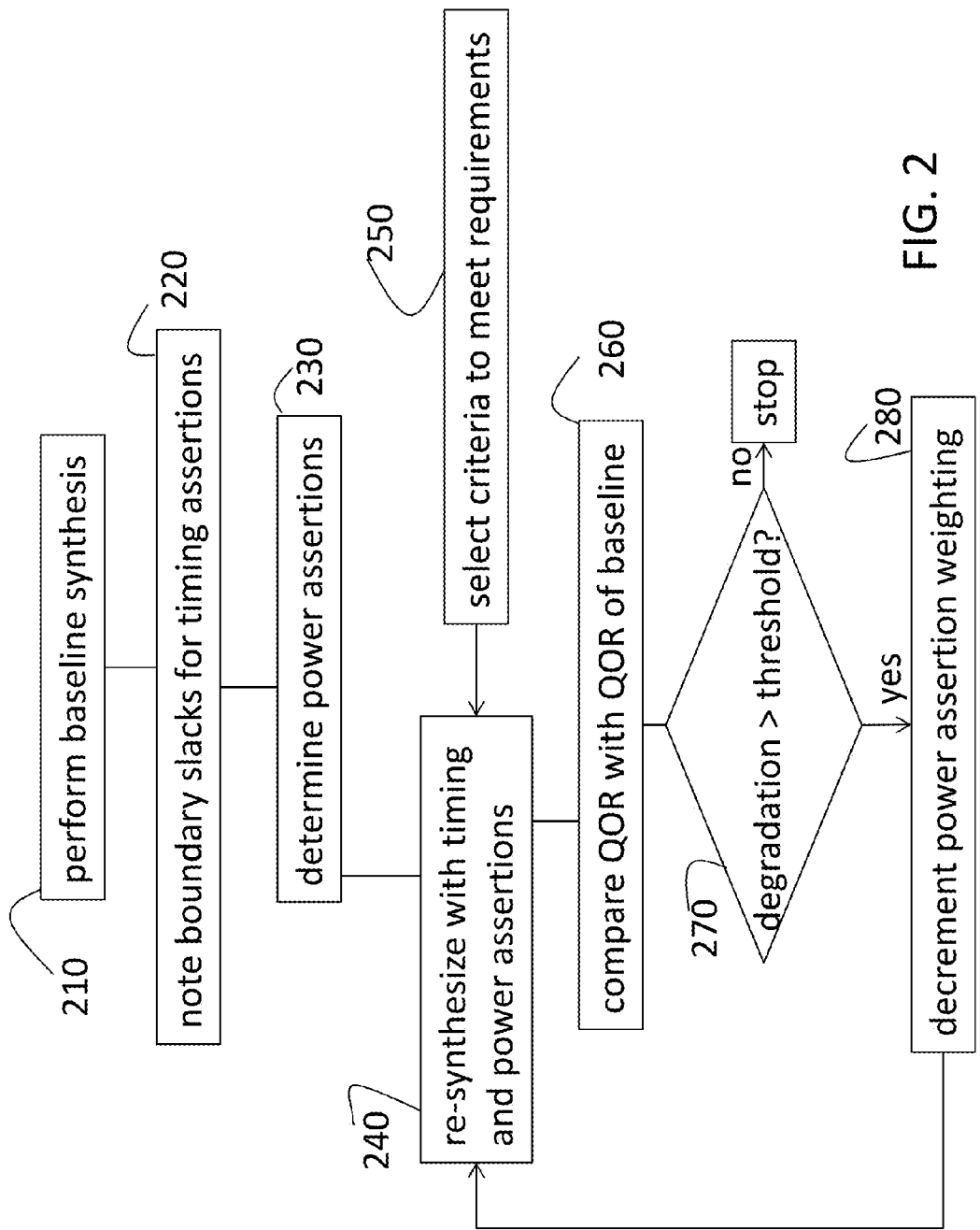
FIG. 2 is a process flow of a method of performing synthesis according to an embodiment of the invention.
Figure 3:
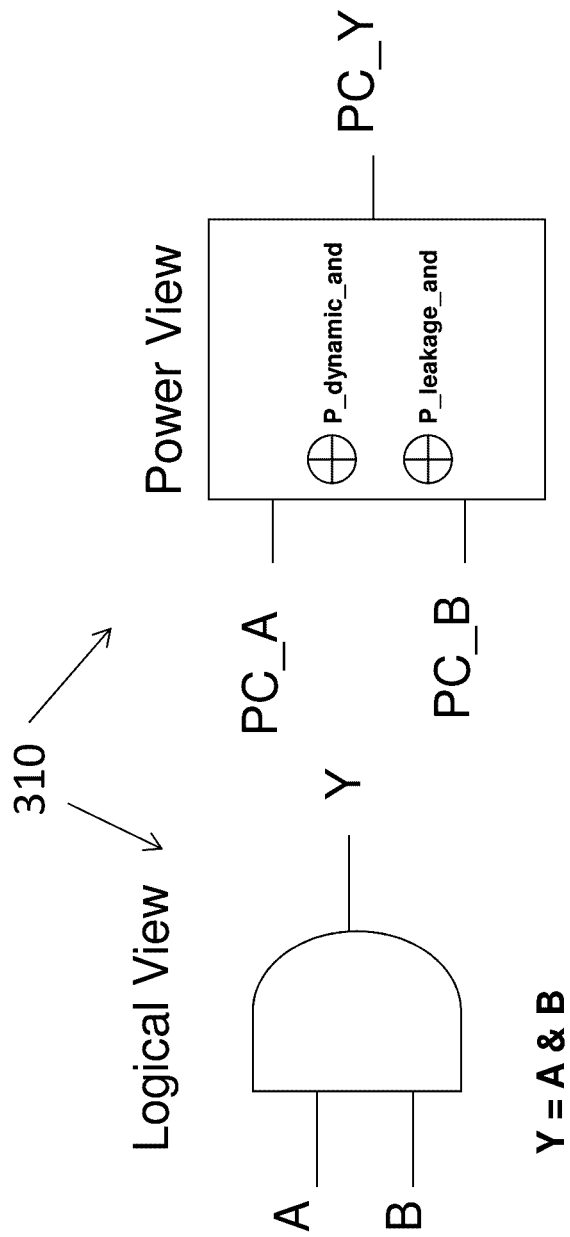
FIG. 3 shows a logical view and a power view of an AND gate for which power cost is calculated according to an embodiment of the invention.
Figure 4:
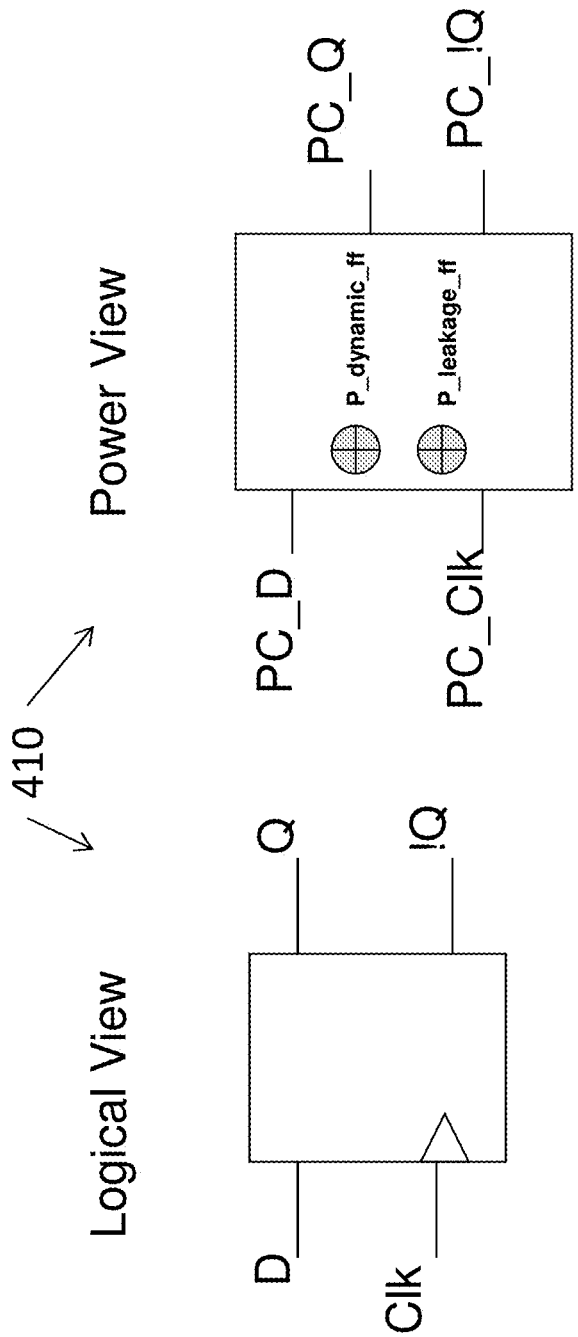
FIG. 4 depicts a logical view and a power view of a flip-flop circuit for which power cost is calculated according to an embodiment of the invention.

FIG. 2 is a process flow of a method of performing synthesis according to an embodiment of the invention. At block 210, performing a baseline synthesis includes performing the synthesis process (with one or more processors 116 of the processing system 110, for example) by using the timing assertions or constraints but without including power assertions for consideration by the synthesis engine. At block 220, noting boundary slacks for timing assertions is optional. The timing slack at any boundary (of a sub-block 125) is a difference between an amount of allotted (expected) time and the actual time for signals to pass through the sub-block 125. The slack may be positive (actual time was less than the expected or allotted time) or negative (actual time was greater than expected or allotted time) at each boundary. Determining power assertions at block 230 may be according to the modeling detailed below. Once the power assertions are computed, re-synthesizing with both the timing assertions and the power assertions, at block 240, initially includes weighting the timing assertions and the power assertions equally. As further detailed below, the power assertions may not be implemented in exactly the same way as the timing assertions. At block 250, selecting one or more techniques to meet the requirements is discussed below. The re-synthesizing itself (block 240) may involve known techniques which are also further discussed below. Once the re-synthesizing is complete at block 240, a quality of result (QOR) for the re-synthesis result and the baseline result are compared. QOR is a known performance indicator for integrated circuits. At block 270, a determination is made whether the degradation in the synthesis result (difference between the QOR of the baseline synthesis result and the QOR of the re-synthesis result) exceeds a threshold value. The threshold value may be selected based on a number of factors such as, for example, specified chip tolerances based on an expected use for the chip Other bases for setting the threshold value may include total negative slack, worst (highest) negative slack, and number of timing paths that fail the performance target, for example. If the difference exceeds the threshold value, then decrementing the power assertion weighting at block 280 includes maintaining the weighting of the timing assertions (e.g., at 1) and reducing the weighting of the power assertions (e.g., to 0.9). The weighting of the power assertions may be decremented linearly or non-linearly based on the initial QOR violation (amount by which the threshold was exceeded). The decrement steps may be modulated to be high or low based on the amount of correction or adjustment needed. That is, if the threshold were exceeded by a relatively large amount (at block 270), the decrement steps for weighting of power assertions may be modulated to be relatively high. With the new weighting for power assertions, re-synthesis is performed again at block 240. Blocks 240 through 280 are performed iteratively until, at block 270, it is determined that the difference in QOR for the re-synthesis result and the baseline result is within the predetermined threshold. As FIG. 2 indicates, based on the threshold value, an extreme outcome would be that the adjusted weighting of the power assertion (block 280) used in the re-synthesis (block 240) becomes close to 0 (i.e., power assertions are excluded and the baseline synthesis is used in order to meet the timing assertions). At the other extreme, a nearly equal weighting of timing and power assertions Determining (computing) power assertions (block 230 of FIG. 2) according to embodiments of the invention is detailed with reference to FIGS. 3-9 below. FIG. 3 shows a logical view and a power view of an AND gate 310 for which power cost is calculated according to an embodiment of the invention. A power cost of the AND gate 310 may be determined according to an embodiment of the invention. The AND gate 310 represents a component within a sub-block 125. The power cost (PC) at output pin Y is given by:

$$PC\_Y = PC\_A + PC\_B + PC\_dynamic\_and + PC\_leakage\_and \quad [EQ. 1]$$

where PC_A and PC_B are the power cost at pins A and B, respectively, and PC_dynamic_and and PC_leakage_and represent an internal power cost of the AND gate 310. FIG. 4 depicts a logical view and a power view of a flip-flop circuit 410 for which power cost is calculated according to an embodiment of the invention. The outputs, Q and !Q, represent the output and inverse output, respectively. The power cost in this case is split between the two outputs (as opposed to the single output, Y, in the AND gate 310 of FIG. 3). The internal power cost (PC_int) is given by:

$$PC\_int = PC\_D + PC\_Clk + P\_dynamic\_ff + P\_leakage\_ff \quad [EQ. 2]$$

where PC_D and PC_Clk are the power costs at the D and Clk pins, and P_dynamic_ff and P_leakage_ff represent the internal power cost of the flip-flop 410. The power cost at each output, Q and !Q, is given by:

$$PC\_Q = rff1 * PC\_int \quad [EQ. 3]$$

$$PC\_!Q = rff2 * PC\_int \quad [EQ. 4]$$

where rff1 and rff2 are ratios of the output power cost attributable to each of the outputs (Q and !Q), such that:

$$rff1 + rff2 = 1 \quad [EQ. 5]$$

The individual values of rff1 and rff2 may be dependent on the capacitance of the respective pin associated with each (i.e., Q or !Q). As discussed below, when components connect to other components, the law of conservation of energy (power) is observed such that the same power cost is not counted more than once.

Figure 5:
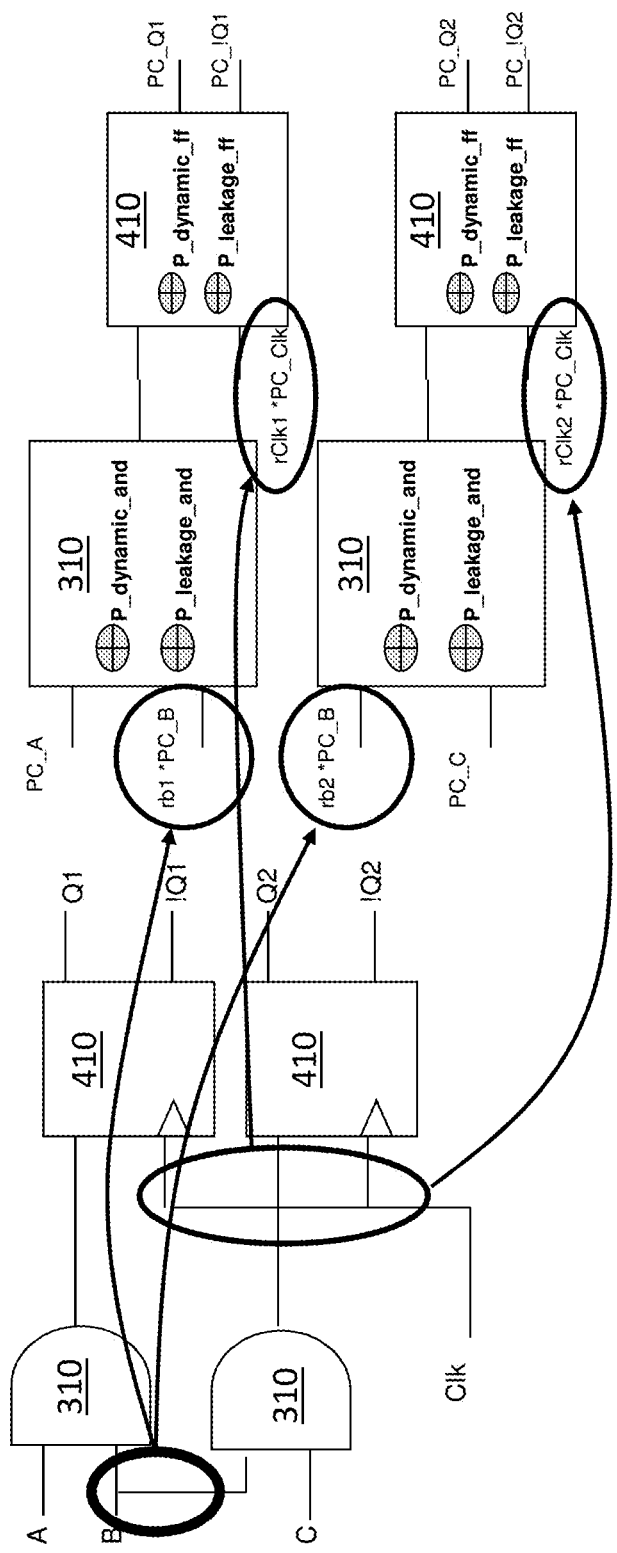
FIG. 5 shows logical and power views of a circuit including AND gates and flip-flop circuits.

FIG. 5 shows logical and power views of a circuit including AND gates 310 and flip-flop circuits 410. The power cost of the circuit (power cost at outputs PC_Q1, PC_!Q1, PC_Q2, and PC_!Q2) may be computed according to an embodiment of the invention using EQs. 1 through 5. First, for convenience, $$X = P\_dynamic\_and + P\_leakage\_and \quad [EQ. 6]$$

$$Y = P\_dynamic\_ff + P\_leakage\_ff \quad [EQ. 7]$$

then, $$PC\_Q1 = rf\!f1 * (Y + rClk1 * PC\_Clk + X + PC\_A + rb1 * PC\_B) \quad [\text{EQ. 8}]$$

$$PC\_!Q1 = rf\!f2 * (Y + rClk1 * PC\_Clk + X + PC\_A + rb1 * PC\_B) \quad [\text{EQ. 9}]$$

$$PC\_Q2 = rf\!f1 * (Y + rClk2 * PC\_Clk + X + PC\_C + rb2 * PC\_B) \quad [\text{EQ. 10}]$$

$$PC\_!Q2 = rf\!f2 * (Y + rClk2 * PC\_Clk + X + PC\_C + rb2 * PC\_B) \quad [\text{EQ. 11}]$$

where the ratios are given by:

$$rb1 + rb2 = 1 \quad [\text{EQ. 12}]$$

$$rClk1 + rClk2 = 1 \quad [\text{EQ. 13}]$$

Power consumption may be inferred in terms of computed power cost (PC). That is, generally, input PC subtracted from output PC is the power consumed by the circuit:

$$\text{ConsumedPower} = PC\_\text{output} - PC\_\text{input} \quad [\text{EQ. 14}]$$

Thus, for the circuit shown in FIG. 5, consumed power is given by $$(PC\_Q1 + PC\_!Q1 + PC\_Q2 + PC\_!Q2) - (PC\_A + rb1 * PC\_B + rb2 * PC\_B + PC\_C + rClk1(PC\_Clk + rClk2 * PC\_Clk) \quad [\text{EQ.15}]$$

which, because rb1+rb2=1 and rClk1+rClk2=1, may be written as:

$$(PC\_Q1 PC\_!Q1 + PC\_Q2 + PC\_!Q2) - (PC\_A + PC\_B + PC\_C + PC\_Clk) \quad [\text{EQ.16}]$$

and further re-written, based on EQs. 8 through 11, as:

$$2 * (P\_\text{dynamic\_and} + P\_\text{leakage\_and} + P\_\text{dynamic\_ff} + P\_\text{leakage\_ff}) \quad [\text{EQ. 17}]$$

As such, consumed power may be inferred entirely in terms of boundary (input/output) power cost. In fact, power consumption of any sub-circuit may be determined from known primary input (PI) and primary output (PO) power costs using EQ. 14.

Figure 6:
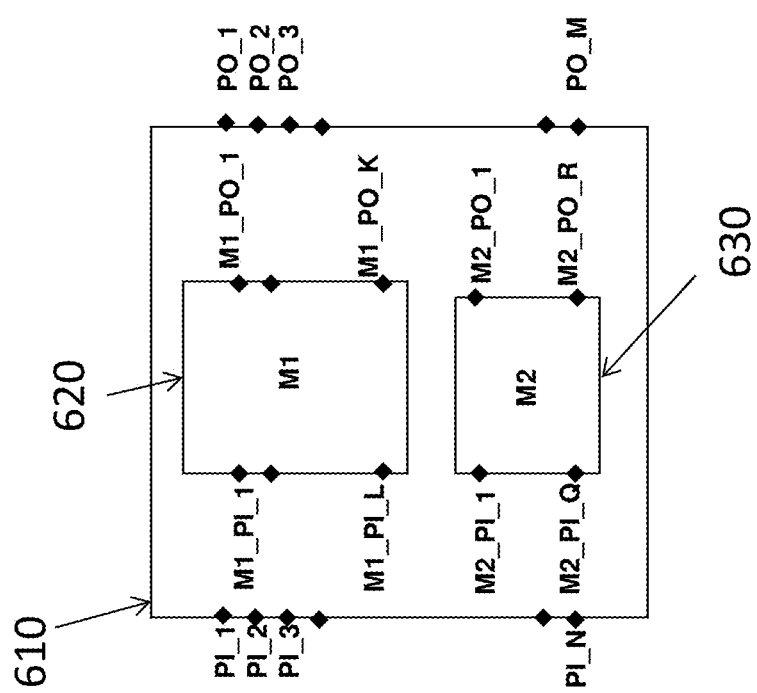
FIG. 6 shows a chip with macros for which power consumption is calculated according to an embodiment of the invention.

FIG. 6 shows a chip 610 with macros 620, 630 for which power consumption is calculated according to an embodiment of the invention. Several primary input (PI) and primary output (PO) pins are shown for the circuit 610 as well as for the macros 620, 630. Power consumption may be computed at the chip 610 level or the macro 620, 630 level based on the primary input (PI) and primary output (PO) power values as follows. Chip power is given by:

$$PC\_PO\_1 + PC\_PO\_2 + \ldots + PC\_PO\_M \quad [\text{EQ. 18}]$$

Chip-level power includes the power cost (PC) at the primary inputs (PI). Power consumption at each macro may be computed as:

$$(PC\_M1\_PO\_1 + \ldots + PC\_M1\_PO\_K) - (PC\_M1\_PI\_1 + \ldots + PC\_M1\_PI\_L) \quad [\text{EQ. 19}]$$

for macro 620, and $$(PC\_M2\_PO\_1 + \ldots + PC\_M2\_PO\_R) - (PC\_M2\_PI\_1 + \ldots + PC\_M2\_PI\_Q) \quad [\text{EQ. 20}]$$

for macro 630.

The power assertion used in synthesis may provide information beyond power consumption values at each boundary of each sub-block 125. As noted with in the discussion of block 220 (FIG. 2), slack (e.g., timing slack) at a given pin refers to the difference between allotted (expected) timing performance and actual timing performance at the pin. In addition to timing constraints, the availability of timing slack values facilitate improvements in the synthesis result by indicating the areas of the chip that have tolerances available (in the case of positive slack) and those that need to be modified to meet timing constraints (in the case of negative slack). In a similar way, power slack may also be modeled, as detailed below.

Figure 7:
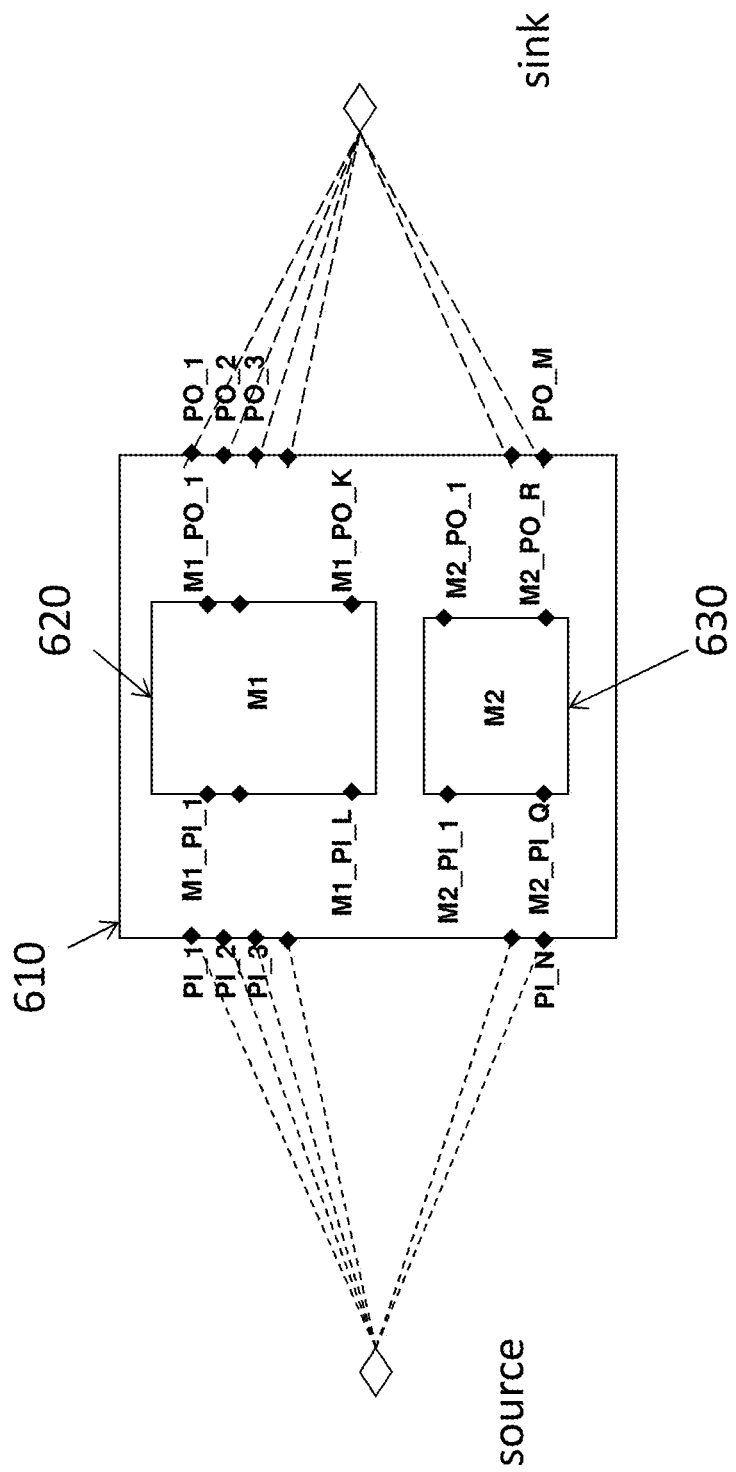
FIG. 7 shows a chip with macros for which power slack is calculated according to an embodiment of the invention.

FIG. 7 shows a chip 610 with macros 620, 630 for which power slack is calculated according to an embodiment of the invention. The chip 610 has a source side and a sink side, as indicated by FIG. 7. In terms of power, all ports are considered to originate at the source side, from a single source, and terminate at the sink side, at a single sink. The source is considered to have zero power cost (PC) and zero power slack (PS). The sink has a power cost equal to the power of the chip, shown in EQ. 18, and a power slack (PS_Sink) given by the chip power subtracted from the target power (based on the power budget). The power slack at each of the nodes (primary output nodes, PO) of the chip 610 is a portion of the power slack at the sink (PS_Sink) proportional to the power cost (PC) at the node relative to power cost of the chip and is given by:

$$PS\_PO\_1 = PS\_\text{Sink} * (PC\_PO\_1 / PC\_\text{chip}) \quad [\text{EQ. 21}]$$

$$PS\_PO\_2 = PS\_\text{Sink} * (PC\_PO\_2 / PC\_\text{chip}) \quad [\text{EQ. 22}]$$

$$PS\_PO\_M = PS\_\text{Sink} * (PC\_PO\_M / PC\_\text{chip}) \quad [\text{EQ. 23}]$$

Similarly, the power slack at the sink can be back-propagated to the primary inputs (PI), given that the power slack at the source is zero. As noted above, a negative power slack at a given node indicates that the power target was exceeded at the node, while a positive power slack value indicates that there is unused allotted power at the node. Power slack facilitates the consideration of an overall power budget at the node level. The power slack for each macro 620, 630 may be described in terms of the power slack at the interface (primary input (PI) and primary output (PO)). That is, for example, the power slack for macro 620 is given by:

$$(PS\_M1\_PO\_1 + \ldots + PS\_M1\_PO\_K) - (PS\_M1\_PI\_1 + \ldots + PS\_M1\_PI\_L) \quad [\text{EQ. 24}]$$

And, the power slack for the macro 630 is given by:

$$(PS\_M2\_PO\_1 + \ldots + PS\_M2\_PO\_R) - (PS\_M2\_PI\_1 + \ldots + PS\_M2\_PI\_Q) \quad [\text{EQ. 25}]$$

Figure 8:
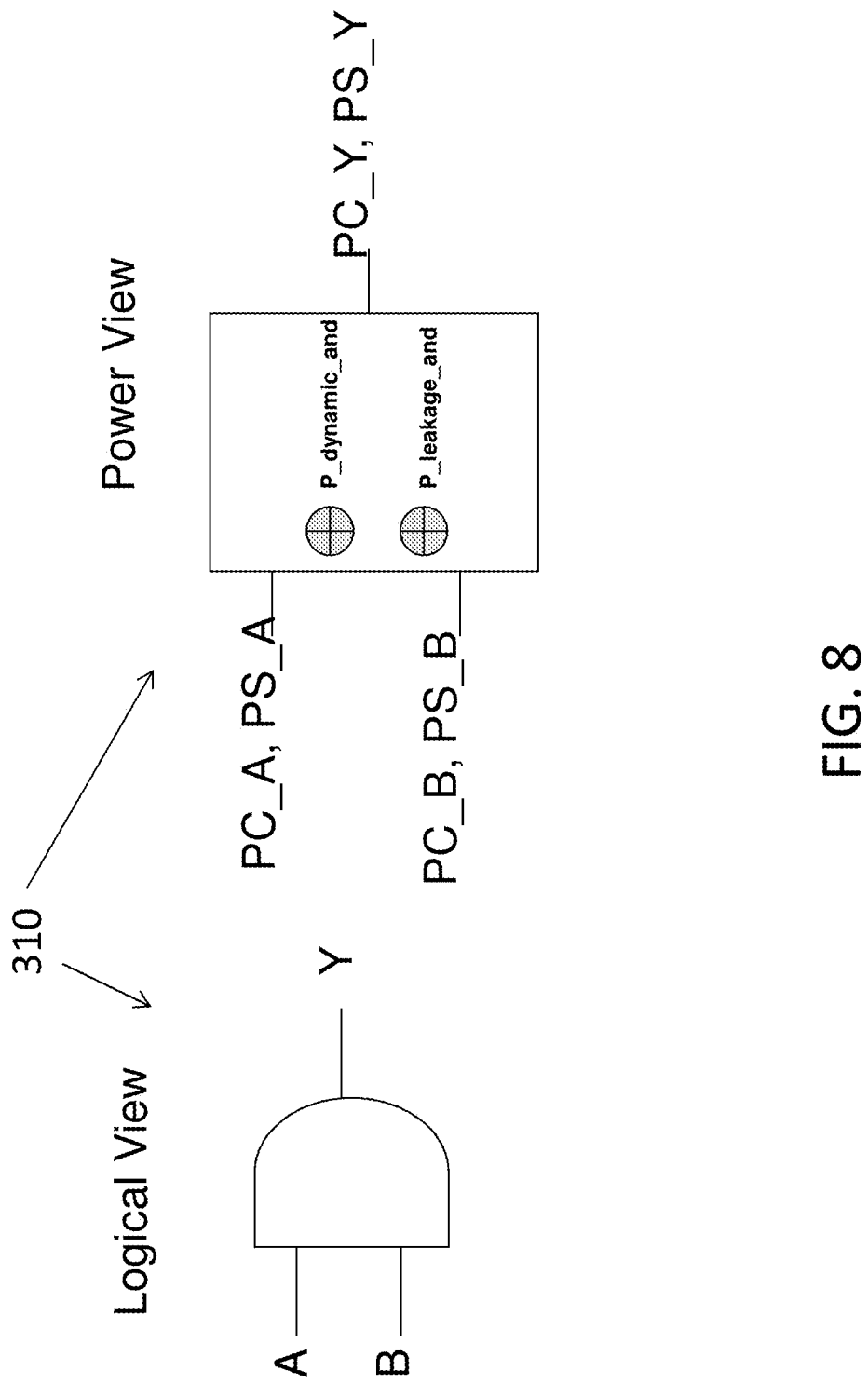
FIG. 8 shows a logical view and a power view of an AND gate for which power slack is calculated according to an embodiment of the invention.

FIG. 8 shows a logical view and a power view of an AND gate 310 for which power slack is calculated according to an embodiment of the invention. The power slack (PS) at each of the inputs (A and B) may be back-propagated from the power slack at the output (Y). Specifically, the power slack at each input is determined as a portion of the power slack at the output proportional to power cost (PC) at the respective input as follows:

$$PS\_A = PS\_Y * [PC\_A / (PC\_A + PC\_B + P\_\text{dynamic\_and} + P\_\text{leakage\_and})] \quad [\text{EQ. 26}]$$

$$PS\_B = PS\_Y * [PC\_B / (PC\_A + PC\_B + P\_\text{dynamic\_and} + P\_\text{leakage\_and})] \quad [\text{EQ. 27}]$$

Figure 9:
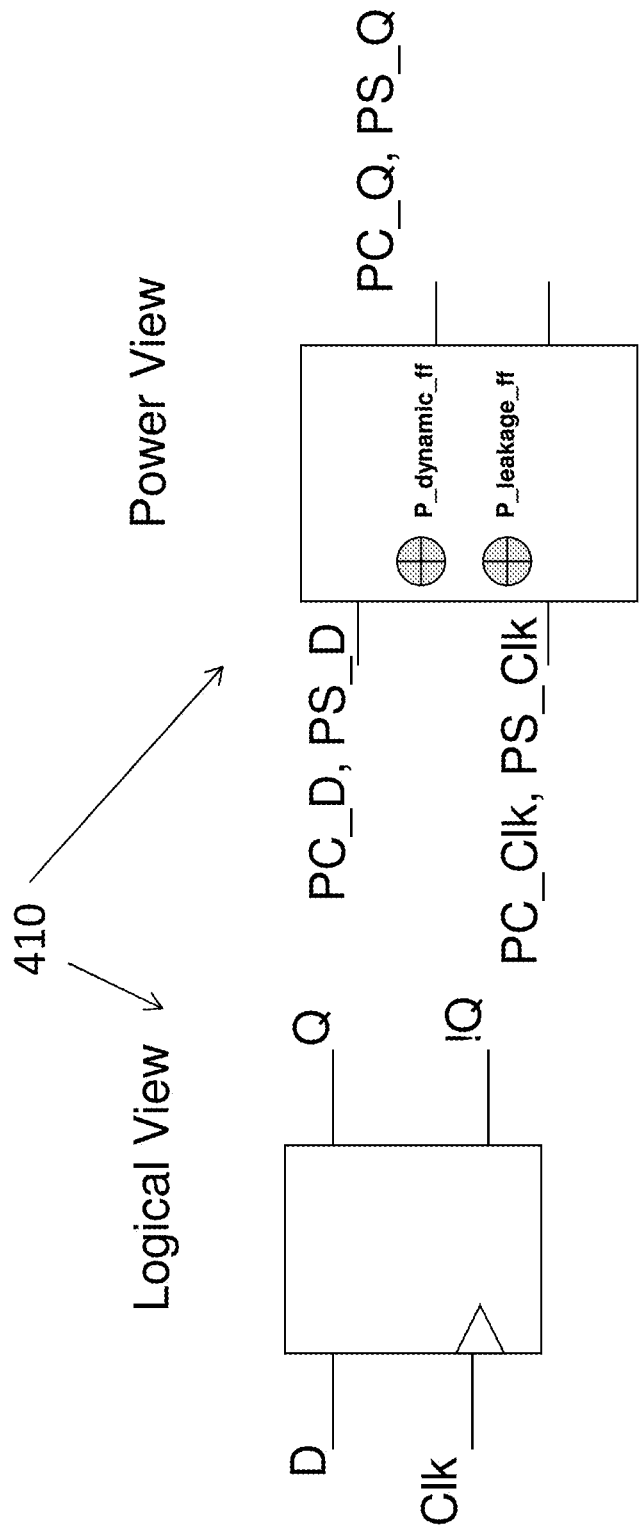
FIG. 9 depicts a logical view and a power view of a flip-flop circuit for which power slack is calculated according to an embodiment of the invention.

FIG. 9 depicts a logical view and a power view of a flip-flop circuit 410 for which power slack is calculated according to an embodiment of the invention. The power slack (PS) at each of the inputs (D and Clk) may be back-propagated from the sum of the power slack at the outputs (Q and !Q). Specifically, the power slack at each input is determined as a portion of the power slack (sum) at the outputs proportional to power cost (PC) at the respective input as follows:

$$PS\_D=(PS\_Q+PS\_!Q)*(PC\_D/(PC\_D+PC\_Clk+ P\_dynamic\_ff+P\_leakage\_ff))] \quad [EQ. 28]$$

$$PS\_Clk=(PS\_Q+PS\_!Q)*(PC\_Clk/(PC\_D+PC\_Clk+ P\_dynamic\_ff+P\_leakage\_ff))] \quad [EQ. 29]$$

Thus, as detailed above, power cost may be forward-propagated and power slack may be back-propagated to develop power assertions or constraints that may be used by the synthesis engine to develop the physical design using pin-level granularity in power information. The power assertions allow the synthesis engine to determine areas of the circuit (sub-blocks) with positive power slacks that may be leveraged in areas of the circuit with negative power slacks, for example.

Once power assertions are computed (block 230, FIG. 2), time and power assertions, with relative weighting as determined at block 280, are used to re-synthesize the logic design at block 240. As noted above, the specific techniques employed by the synthesis engine to output the physical design may be known techniques. The techniques may be chosen (on a rule-based basis, for example) from a standard cell library used by the synthesis engine. Exemplary techniques include changing the placement of sub-blocks (which may change the length of wires needed and, thus, timing of signals, for example), or substituting devices with high threshold voltage to improve adherence to timing constraints. In determining which techniques to use and how to use them, other factors may be considered. For example, typically, in a circuit design, increase in timing efficiency and increase in power efficiency are inversely proportional. That is, when the tightest timing constraints are achieved, adherence of power usage to power assertions tends to suffer. This relates to the rationale for the process at block 280 shown in FIG. 2. When timing constraints are decided as the more critical of the requirements (between timing and power constraints), and when the QOR indicates that timing constraints are not met, then the weighting of power assertions are decremented (sacrificed to an extent) in order to improve timing of the physical design resulting from the synthesis (re-synthesis at block 240). In addition to the penalty to meeting timing constraints that may result from improving adherence to power assertions, too much granularity in power assertions (e.g., at each pin) may create too much overhead processing for the synthesis engine. As a result, criteria associated with bucketized power assertions (a range rather than a particular value) may be used to select techniques for the re-synthesis at block 240. The criteria selection (as part of block 250), which may be a rule-based process, is discussed further below.

Figure 10:
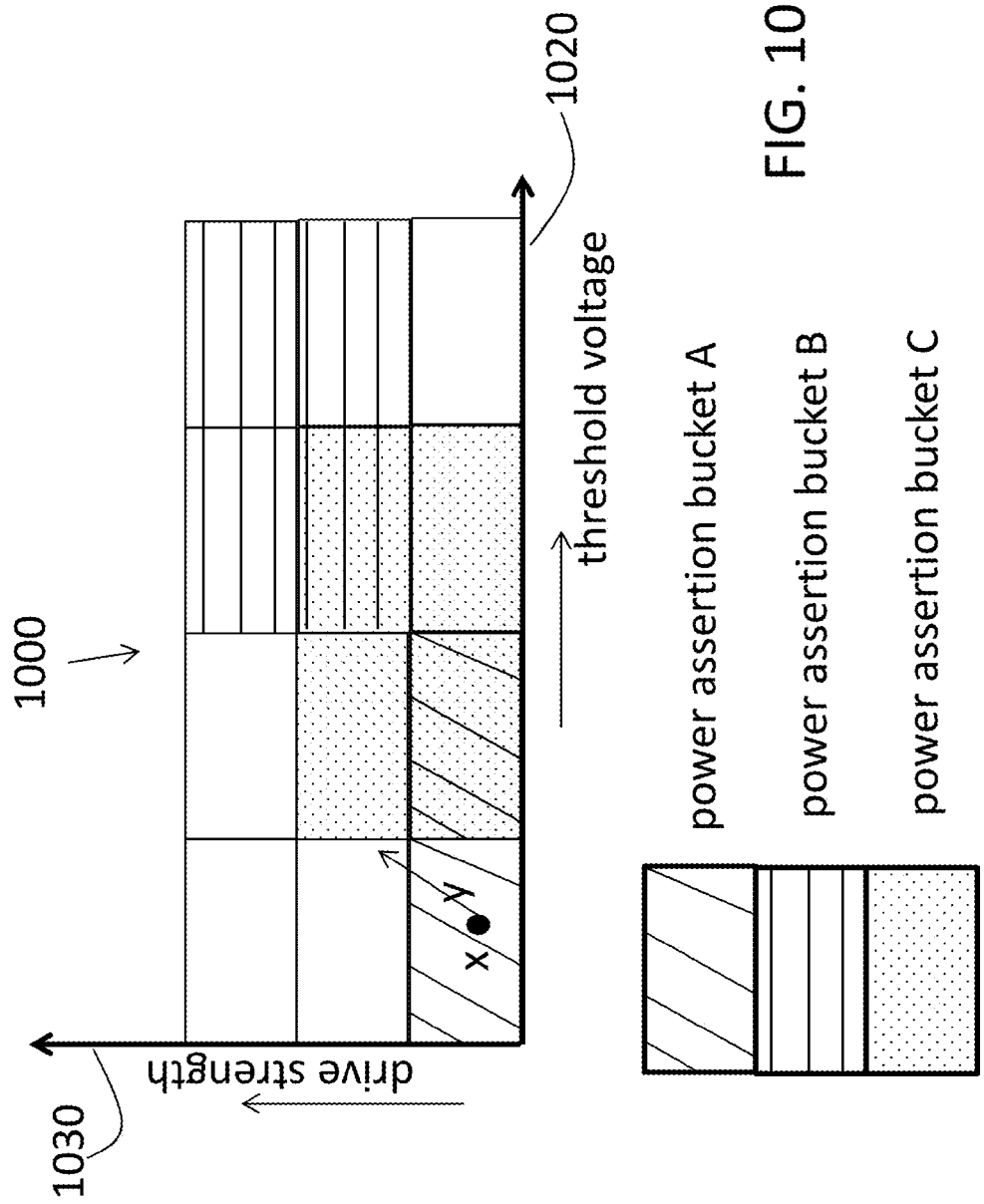
FIG. 10 illustrates a mapping that facilitates selection of a technique for re-synthesis according to an embodiment of the invention.

FIG. 10 illustrates a mapping 1000 that facilitates selection of techniques for re-synthesis according to an embodiment of the invention. Threshold voltage ($V_T$) increases along the axis 1020, and drive strength (block hardware code, BHC) increases along axis 1030. As noted previously, adherence to timing constraints is generally at odds with adherence to power constraints. Thus, one end of the voltage threshold range corresponds with tighter timing adherence in the physical design while the other end of the voltage threshold range corresponds with tighter power adherence in the physical design. Certain ranges of $V_T$ and BHC fall into certain power assertion ranges or buckets, as shown in FIG. 10. The ranges apply for given values of time slack (TS), dynamic power, and leakage power for a given macro. The different buckets may have different granularities and may be associated with different techniques to be used by the synthesis engine. For example, based on the power assertion calculation (block 230, FIG. 2), a range of power assertion values (power assertion bucket C) may be determined. Then, based on the mapping 1000, the dotted area shown in FIG. 10 that corresponds with power assertion bucket C may be used to select the range of threshold voltages and drive strengths that will be used (targeted) by the synthesis engine (processor 116). If a re-synthesis (block 240) results in power assertions that fall in a portion of power assertion bucket A that does not overlap with power assertion bucket C (see, e.g., x in FIG. 10), then the further re-synthesis (with a reduced weighting on the power assertions) would target the threshold voltage and drive strength indicated by the mapping 1000 (as indicated by the arrow y in FIG. 10). Further that targeted move (from power assertion bucket A to power assertion bucket C) may correspond with certain techniques to be implemented by the synthesis engine (e.g., moving sub-blocks). Power assertions at a fine-grain (pin-based) level may be bucketed to trigger certain power optimization techniques in the synthesis engine, for example.

Figure 11:
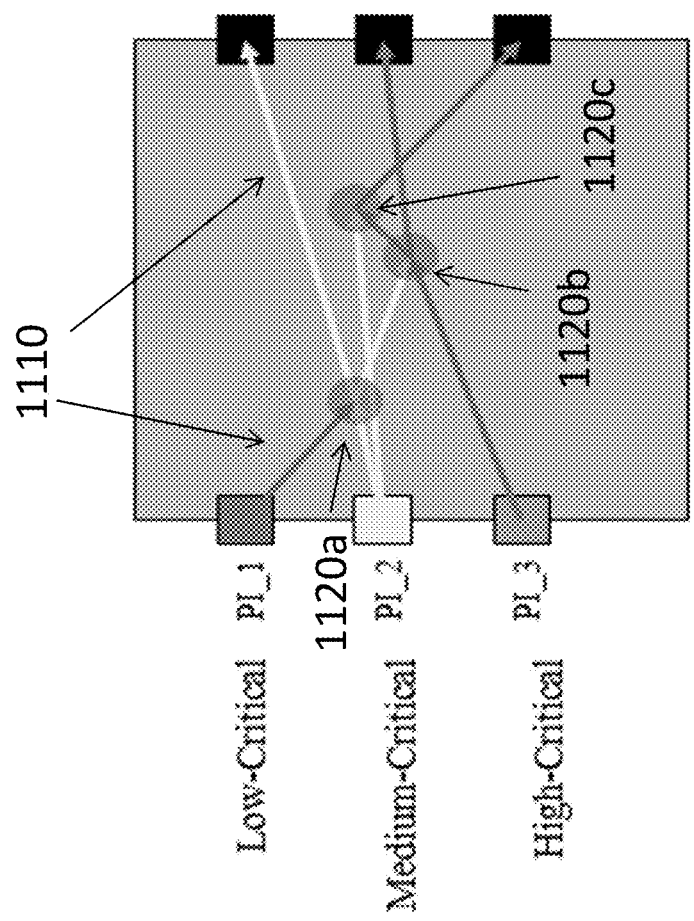
FIG. 11 illustrates an arbitration strategy in the synthesis process according to an embodiment of the invention.

FIG. 11 illustrates an arbitration strategy in the synthesis process (block 240, FIG. 2) according to an embodiment of the invention. FIG. 11 shows an exemplary subset of a synthesis process focused on three primary input pins (PI_1, PI_2, PI_3) associated with three different power assertion buckets. Based on the corresponding power assertion bucket, the optimization strategy (synthesis technique) selected for each primary input pin is different. The lines 1110 indicate the logic/timing path propagation from each primary input pin based on the corresponding optimization strategy. The intersections 1120a, 1120b, 1120c among the lines illustrate the arbitration strategy that may be implemented when propagating paths from two different power assertions buckets intersect. As shown, an exemplary arbitration strategy is to follow the higher criticality power assertion path and abandon the path that would be generated based on the lower criticality power assertion bucket. That is, for example, when the paths from primary input pin PI_1 (associated with a lower criticality power assertion bucket) and primary input pin PI_2 (associated with a relatively higher criticality power assertion bucket) meet at intersection 1120a, the path generated by the optimization strategy for the power assertion bucket associated with primary input pin PI_1 is abandoned in favor of following the relatively higher criticality path generated by the optimization strategy for the power assertion bucket associated with primary input pin PI_9 2.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A system to obtain a physical design of an integrated circuit from a logical design, the system comprising:
   a memory device configured to store a logical design; and
   a processor configured to execute a synthesis engine, the processor being further configured to:
      perform a baseline synthesis to obtain a baseline physical design using timing constraints and an overall power budget;
      compute power assertions;
      perform a re-synthesis using the timing constraints and the power assertions to obtain a new physical design;
      compare the new physical design with the baseline physical design to determine a degradation of the new physical design in comparison with the baseline physical design;
      reduce a weighting of the power assertions relative to the timing constraints based on the degradation; and
      iteratively perform the re-synthesis, compare the new physical design with the baseline physical design, and reduce the weighting until the degradation is below a threshold value.

2. The system according to claim 1, wherein the processor is configured to compute the power assertions based on propagating a computation of power cost for nodes in the integrated circuit in a first direction.

3. The system according to claim 2, wherein the processor is configured to compute the power assertion based on propagating a computation of power slack for the nodes in a second direction, the second direction being opposite the first direction.

4. The system according to claim 1, wherein the processor is configured to perform the re-synthesis by selecting a technique based on the power assertions and the weighting of the power assertions.

5. The system according to claim 4, wherein the technique corresponds with a range of threshold voltage values and drive strength values targeted by the processor in performing the re-synthesis.

6. The system according to claim 5, wherein the technique is selected from a standard cell library.

7. A computer program product storing instructions which, when executed by a processor, cause the processor to implement a method of obtaining a physical design of an integrated circuit from a logical design, the method comprising:
   performing a baseline synthesis to obtain a baseline physical design using timing constraints and an overall power budget;
   computing power assertions;
   performing a re-synthesis using the timing constraints and the power assertions to obtain a new physical design;
   comparing the new physical design with the baseline physical design to determine a degradation of the new physical design in comparison with the baseline physical design;
   reducing a weighting of the power assertions relative to the timing constraints based on the degradation; and
   iteratively executing the performing the re-synthesis, the comparing, and the reducing until the degradation is below a threshold value.

8. The computer program product according to claim 7, wherein the computing the power assertions includes propagating a computation of power cost for nodes in the integrated circuit in a first direction.

9. The computer program product according to claim 7, wherein the computing the power assertions includes propagating a computation of power slack for the nodes in a second direction, the second direction being opposite the first direction.

10. The computer program product according to claim 7, wherein the performing the re-synthesis includes selecting a technique based on the power assertions and the weighting of the power assertions.

11. The computer program product according to claim 10, wherein the technique corresponds with a range of threshold voltage values and drive strength values targeted by the performing the re-synthesis.

12. The computer program product according to claim 11, wherein the technique is selected from a standard cell library.

* * * * *